United States Patent
Chehade et al.

(10) Patent No.: US 11,272,637 B2
(45) Date of Patent: Mar. 8, 2022

(54) RACK ARRANGEMENT FOR A DATA CENTER

(71) Applicant: OVH, Roubaix (FR)

(72) Inventors: Ali Chehade, Templeuve (FR); Alexandre Alain Jean-Pierre Meneboo, Harnes (FR); Etienne Zahm, La Madeleine (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/180,306

(22) Filed: Feb. 19, 2021

(65) Prior Publication Data

US 2021/0274676 A1    Sep. 2, 2021

(30) Foreign Application Priority Data

Feb. 28, 2020    (EP) ..................... 20315029

(51) Int. Cl.
*H05K 7/18*    (2006.01)
*H05K 7/14*    (2006.01)

(52) U.S. Cl.
CPC .......... *H05K 7/183* (2013.01); *H05K 7/1488* (2013.01)

(58) Field of Classification Search
CPC ....... H05K 7/183; H05K 7/186; H05K 7/1488
See application file for complete search history.

(56) References Cited

U.S. PATENT DOCUMENTS

| | | | |
|---|---|---|---|
| 6,451,475 B1 * | 9/2002 | Sherwood | H01M 50/20 429/100 |
| 6,482,541 B1 * | 11/2002 | Bator, Jr | H01M 50/20 429/100 |
| 6,719,150 B2 * | 4/2004 | Marraffa | H01M 50/20 211/49.1 |
| 7,230,836 B2 * | 6/2007 | Miller | H04Q 1/06 174/51 |
| 9,099,710 B2 * | 8/2015 | Lee | H01M 50/20 |
| 9,130,385 B2 * | 9/2015 | Chen | H02J 7/0044 |
| 9,380,727 B2 * | 6/2016 | Bailey | H05K 7/1491 |

(Continued)

FOREIGN PATENT DOCUMENTS

WO    2017/223539 A1    12/2017

OTHER PUBLICATIONS

Extended European Search Report with regard to the European Patent Application No. EP 120315029.7 dated Sep. 18, 2020.

*Primary Examiner* — Stanton L Krycinski
(74) *Attorney, Agent, or Firm* — BCF LLP

(57) ABSTRACT

A rack arrangement for a data center includes an assembly frame including vertical beams, lateral beams connected to the vertical beams, and transverse beams connected to the vertical beams. The transverse beams extend at least partly in a depth direction of the assembly frame. A rack-supporting platform is connected between two of the lateral beams and extends horizontally between four of the vertical beams. Each rack of a plurality of racks is configured to support computer equipment or cooling equipment for servicing the data center. A first rack is supported at least in part by two of the lateral beams. A second rack is disposed above the first rack and disposed atop the rack-supporting platform. The rack-supporting platform is supported in part by a top portion of the first rack such that a load of the second rack is partly applied on the first rack through the rack-supporting platform.

18 Claims, 12 Drawing Sheets

(56) References Cited

U.S. PATENT DOCUMENTS

| | | | | |
|---|---|---|---|---|
| 9,532,484 B2* | 12/2016 | Franklin | ................ | H05K 7/183 |
| 10,219,400 B2* | 2/2019 | Klaba | ................ | A47B 87/0292 |
| 10,327,351 B2* | 6/2019 | McGraw | ............ | H05K 7/20709 |
| 10,462,926 B2* | 10/2019 | Gold | .................... | H05K 7/1489 |
| 10,863,646 B1* | 12/2020 | Rampey | ............... | H05K 7/1488 |
| 10,925,189 B2* | 2/2021 | Cheong | ............... | H05K 7/1488 |
| 2004/0057216 A1* | 3/2004 | Smith | ................. | H05K 7/1488 |
| | | | | 361/724 |
| 2007/0278169 A1* | 12/2007 | Grainger | ............... | B65D 19/08 |
| | | | | 211/186 |
| 2017/0359918 A1 | 12/2017 | Klaba et al. | | |
| 2019/0104636 A1 | 4/2019 | Jochim et al. | | |
| 2019/0182978 A1 | 6/2019 | Bonenfant et al. | | |
| 2019/0309966 A1* | 10/2019 | Klaba | .................... | F25B 39/04 |
| 2020/0163256 A1* | 5/2020 | Chehade | ............. | H05K 7/1488 |
| 2021/0022270 A1* | 1/2021 | Embleton | ............. | H05K 7/183 |
| 2021/0084789 A1* | 3/2021 | Kuo | .................... | H05K 7/1488 |

\* cited by examiner

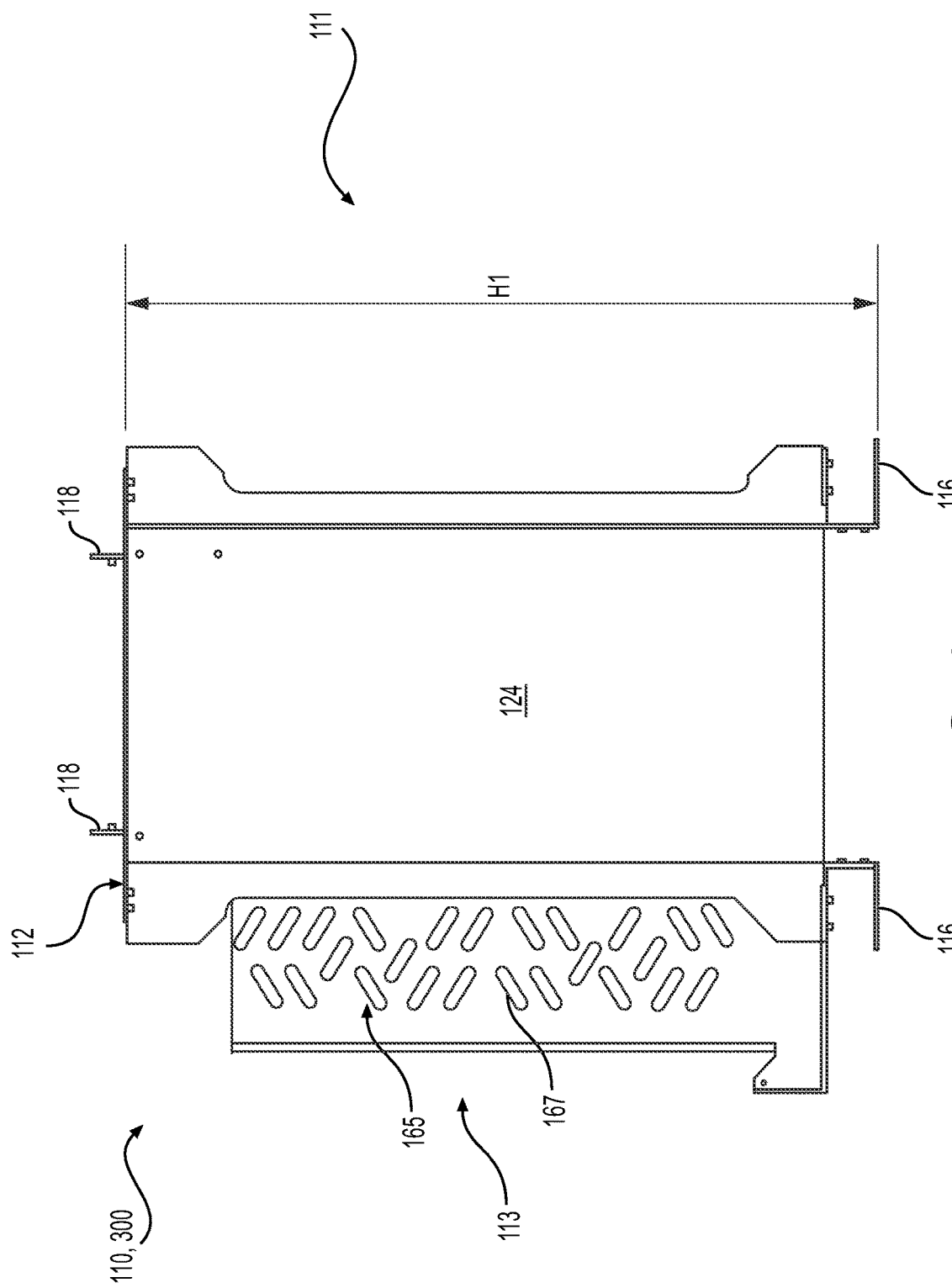

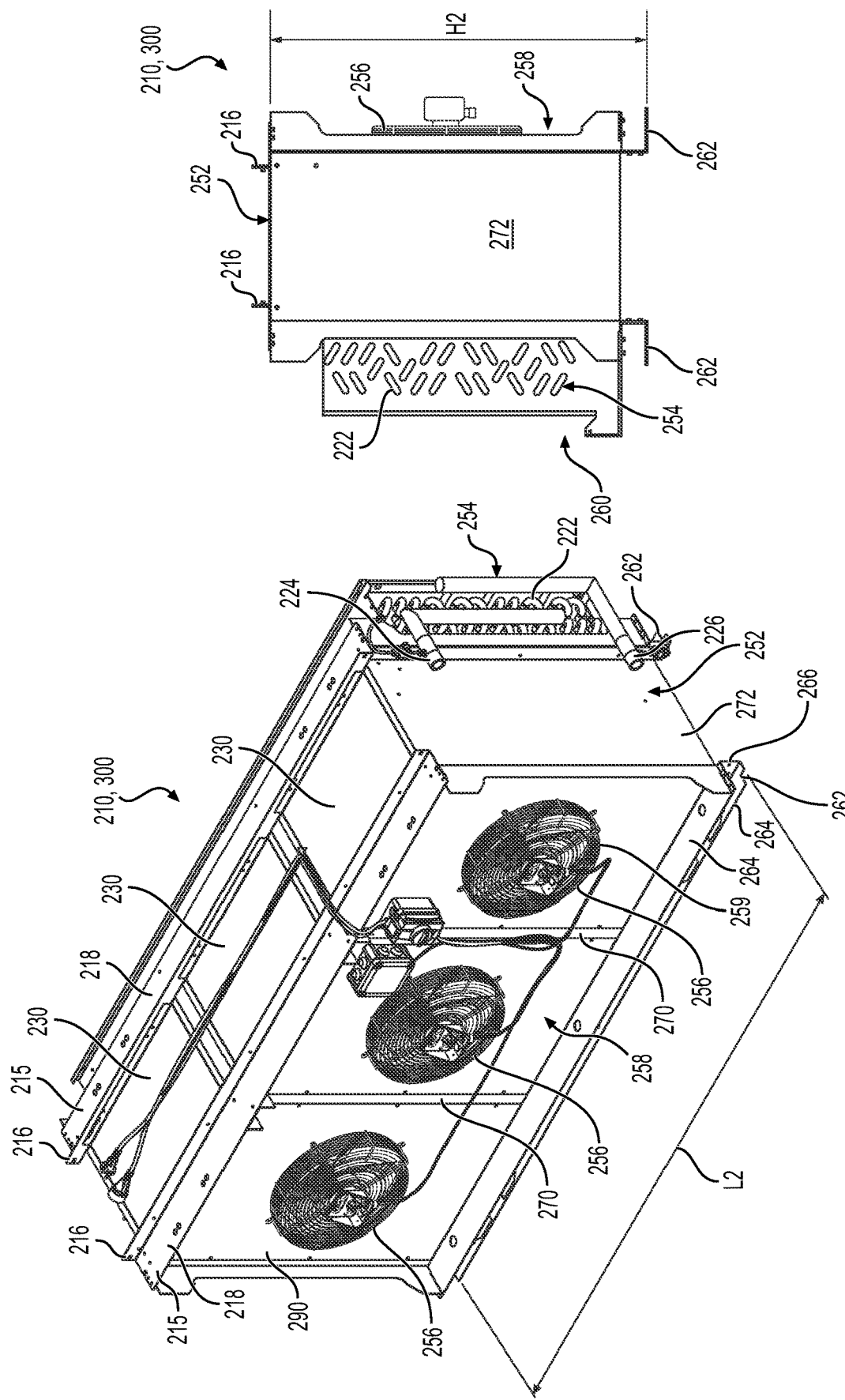

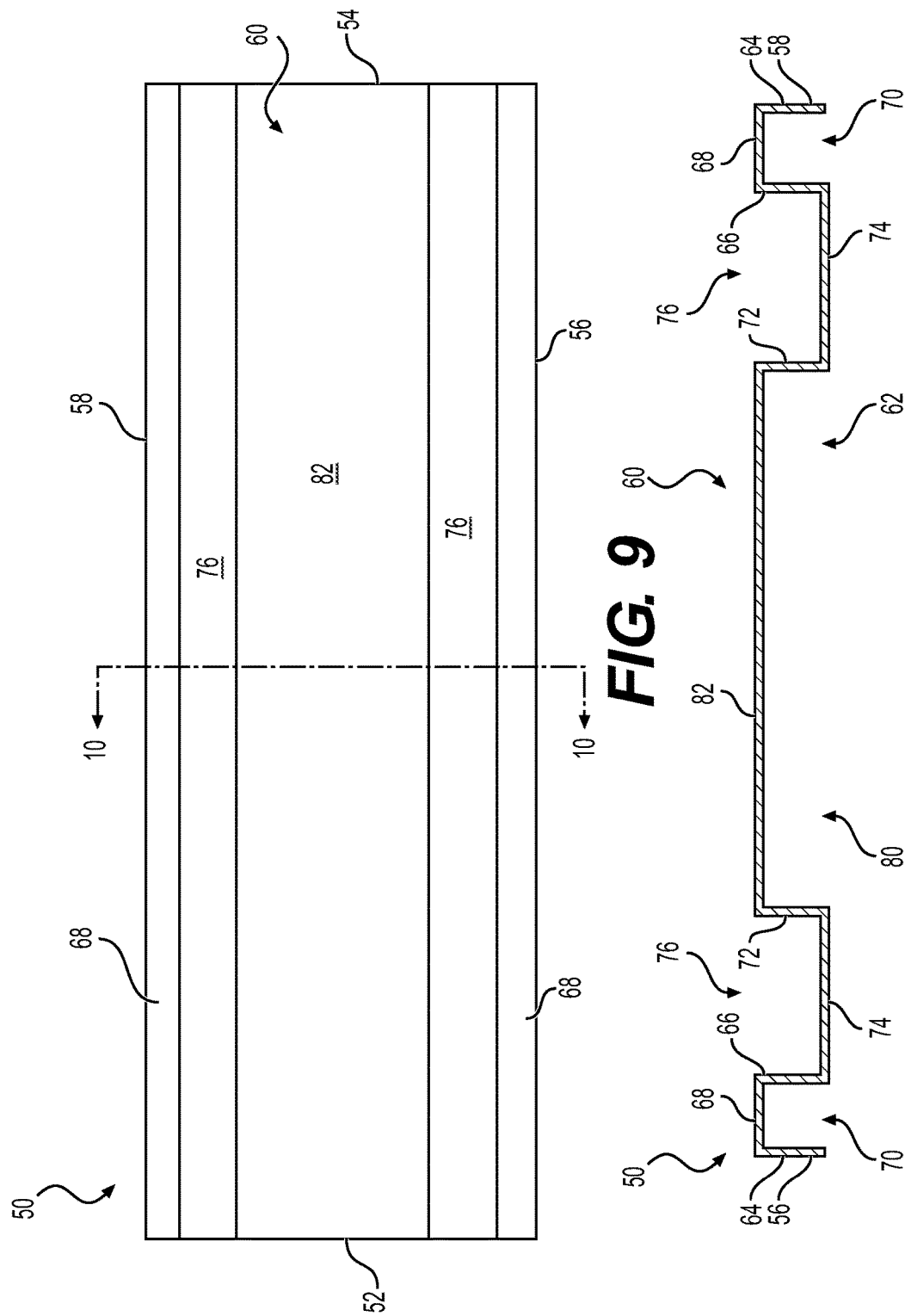

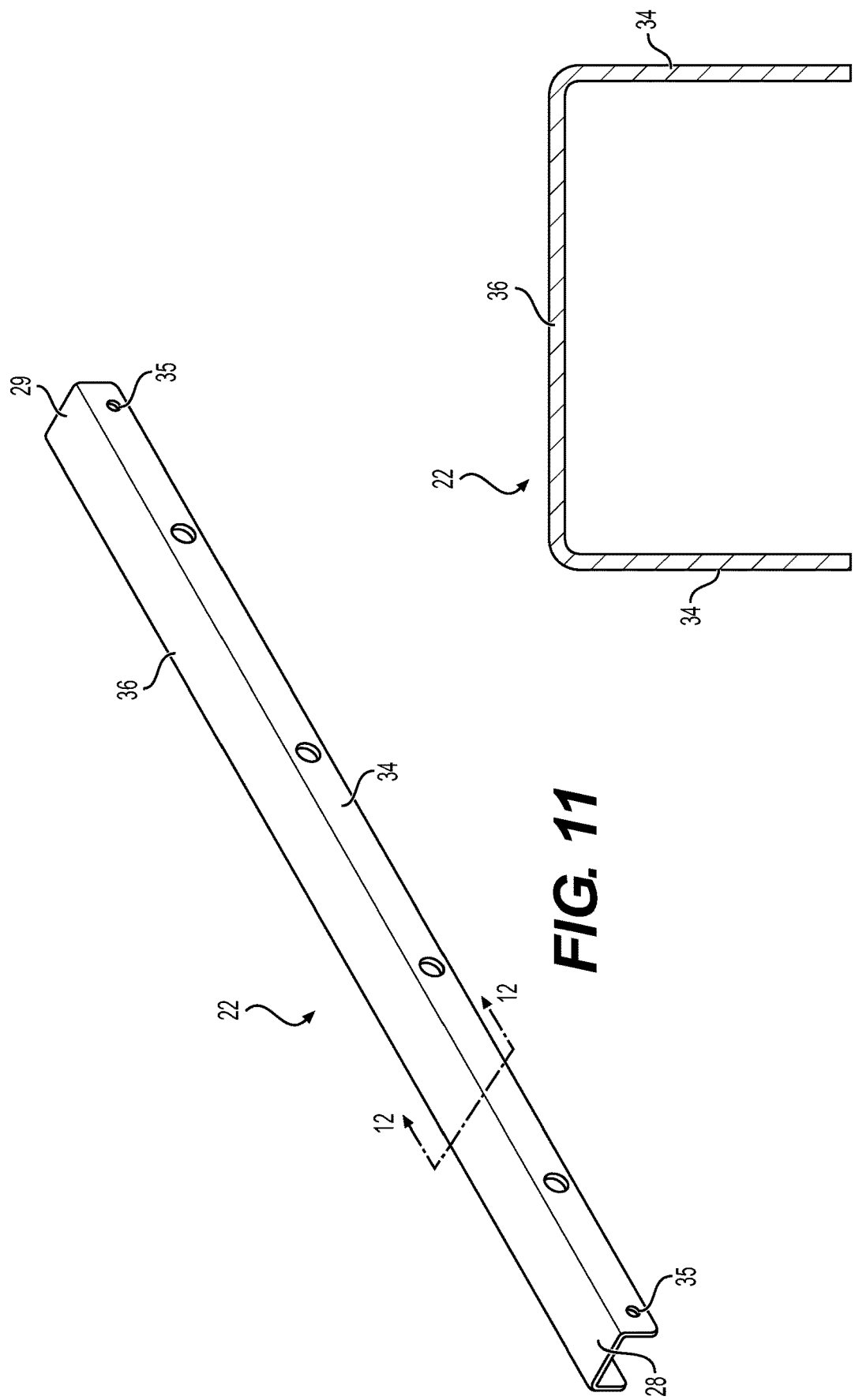

RACK ARRANGEMENT FOR A DATA CENTER

CROSS-REFERENCE

The present application claims priority from European Patent Application no. 20315029.7, filed on Feb. 28, 2020, the disclosure of which is incorporated by reference herein in its entirety.

FIELD OF TECHNOLOGY

The present technology relates to rack arrangements for data centers.

BACKGROUND

A data center houses many computer systems supported on server racks that are typically arranged in rows. It is generally desirable to fit as many server racks within the data center as possible for efficient use of the limited floor space thereof.

To address the limited floor space of data centers, it has been proposed to provide server racks that are disposed one above the other so as to exploit the vertical space of the data center. However, the significant size and weight of server racks can be a limiting factor in this proposed solution. For instance, a frame that could support the server racks would have to be designed sufficiently strong to withstand the important loads of the server racks.

There is therefore a desire for a rack arrangement for a data center which can alleviate at least some of these drawbacks.

SUMMARY

It is an object of the present technology to ameliorate at least some of the inconveniences present in the prior art.

According to one aspect of the present technology, there is provided a rack arrangement for a data center. The rack arrangement includes an assembly frame including: a plurality of vertical beams extending vertically; a plurality of lateral beams connected to the vertical beams, each lateral beam of the plurality of lateral beams being connected between two of the vertical beams; and a plurality of transverse beams connected to the vertical beams, each transverse beam of the plurality of transverse beams being connected between two of the vertical beams, the transverse beams extending at least partly in a depth direction of the assembly frame. The rack arrangement also includes a rack-supporting platform connected between two of the lateral beams, the rack-supporting platform extending horizontally between four of the vertical beams. The rack arrangement also includes a plurality of racks supported by the assembly frame. Each rack of the plurality of racks is configured to support computer equipment or cooling equipment for servicing the data center. The plurality of racks includes: a first rack supported at least in part by two of the lateral beams of the assembly frame, the first rack having a first rack frame configured for supporting the computer equipment or cooling equipment; and a second rack disposed above the first rack and disposed atop the rack-supporting platform, the second rack having a second rack frame for supporting the least one of computer equipment or cooling equipment. The rack-supporting platform is supported in part by a top portion of the first rack such that a load of the second rack is at least partly applied on the first rack through the rack-supporting platform.

In some embodiments, the vertical beams, the lateral beams and the transversal beams are made of bent sheet metal.

In some embodiments, the rack-supporting platform is made of bent sheet metal.

In some embodiments, the rack-supporting platform extends between two of the lateral beams that are vertically aligned with one another.

In some embodiments, a vertical dimension of the first rack is equal to a vertical dimension of the second rack.

In some embodiments, each pair of the vertical beams that are interconnected by given ones of the lateral beams are spaced apart by a distance approximately equal to a width of any one of the first server rack and the second server rack.

In some embodiments, the second rack is disposed on an upper side of the rack-supporting platform; the upper side of the rack-supporting platform defines at least one upper recess; and the upper side of the rack-supporting platform has a shape that matches a shape of a lower portion of the second rack such that part of the second rack is received in the at least one upper recess of the rack-supporting platform.

In some embodiments, the rack-supporting platform has a lower side that is in contact with the first rack; the lower side of the rack-supporting platform defines a lower recess; and the lower side of the rack-supporting platform has a shape that matches a shape of the upper portion of the first rack such that part of the first rack is received in the lower recess of the rack-supporting platform.

In some embodiments, the second rack frame includes two laterally-extending support members disposed at the lower portion of the second rack; the at least one upper recess includes two upper recesses extending laterally; and the laterally-extending support members of the second rack are received in the two upper recesses of the rack-supporting platform.

In some embodiments, the load of the second rack is at least partly applied on the lateral beams and vertical beams of the assembly frame.

In some embodiments, the rack-supporting platform is a first rack-supporting platform. The rack arrangement also includes: a second rack-supporting platform connected between two of the lateral beams, the second rack-supporting platform extending horizontally between four of the vertical beams, the second rack-supporting platform being vertically higher than the first rack-supporting platform; and a third rack disposed above the second rack and disposed atop the second rack-supporting platform, the third rack having a third rack frame for supporting the computer equipment or the cooling equipment. The second rack-supporting platform is supported in part by a top portion of the second rack such that a load of the third rack is at least partly applied on the second rack through the second rack-supporting platform.

In some embodiments, the assembly frame further comprises an upper railing connected to the vertical beams, the upper railing supporting at least one conduit for feeding cooling fluid to the plurality of racks.

In some embodiments, a majority of the load of the second rack is applied on the first rack.

According to another aspect of the present technology, there is provided a method of assembling a rack arrangement for a data center. The method includes providing an assembly frame including: a plurality of vertical beams extending vertically; a plurality of lateral beams connected to the vertical beams, each lateral beam of the plurality of lateral beams being connected between two of the vertical beams; and a plurality of transverse beams connected to the vertical beams, each transverse beam of the plurality of transverse beams being connected between two of the vertical beams, the transverse beams extending at least partly in a depth direction of the assembly frame. The method also includes: installing a first rack such that the first rack is supported at least in part by two of the lateral beams of the assembly frame, the first rack having a first rack frame configured for supporting computer equipment or cooling equipment for servicing the data center; positioning a rack-supporting platform atop the first rack such that the rack-supporting platform is supported by a top portion of the first rack, the rack-supporting platform extending between four of the vertical beams; connecting the rack-supporting platform between two of the lateral beams; and installing a second rack such that the second rack is disposed atop the rack-supporting platform, the second rack being configured to support computer equipment or cooling equipment for servicing the data center, a load of the second rack being at least partly applied on the first rack through the rack-supporting platform.

In some embodiments, the rack-supporting platform is a first rack-supporting platform. The method also includes: positioning a second rack-supporting platform atop the second rack such that the second rack-supporting platform is supported by a top portion of the second rack; connecting the second rack-supporting platform between two of the lateral beams; and installing a third rack such that the second rack is disposed atop the rack-supporting platform, the third rack being configured to support computer equipment or cooling equipment for servicing the data center, a load of the third rack being at least partly applied on the second rack through the second rack-supporting platform.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 2B is a left side elevation view of the computer rack of FIG. 2A;

FIG. 3 is a perspective view, taken from a front, right side, of an air handler rack of the data center of FIG. 1;

FIG. 4 is a left side elevation view of the air handler rack of FIG. 3;

FIG. 9 is a top plan view of a rack-supporting platform of the rack arrangement of FIG. 1;

FIG. 10 is a cross-sectional view of the rack-supporting platform of FIG. 9 taken along line 10-10 in FIG. 9;

FIG. 11 is a perspective view of a transversal beam of the assembly frame of FIG. 8;

FIG. 12 is a cross-sectional view of the transversal beam of FIG. 11 taken along line 12-12 in FIG. 11;

DETAILED DESCRIPTION

Figure 1:
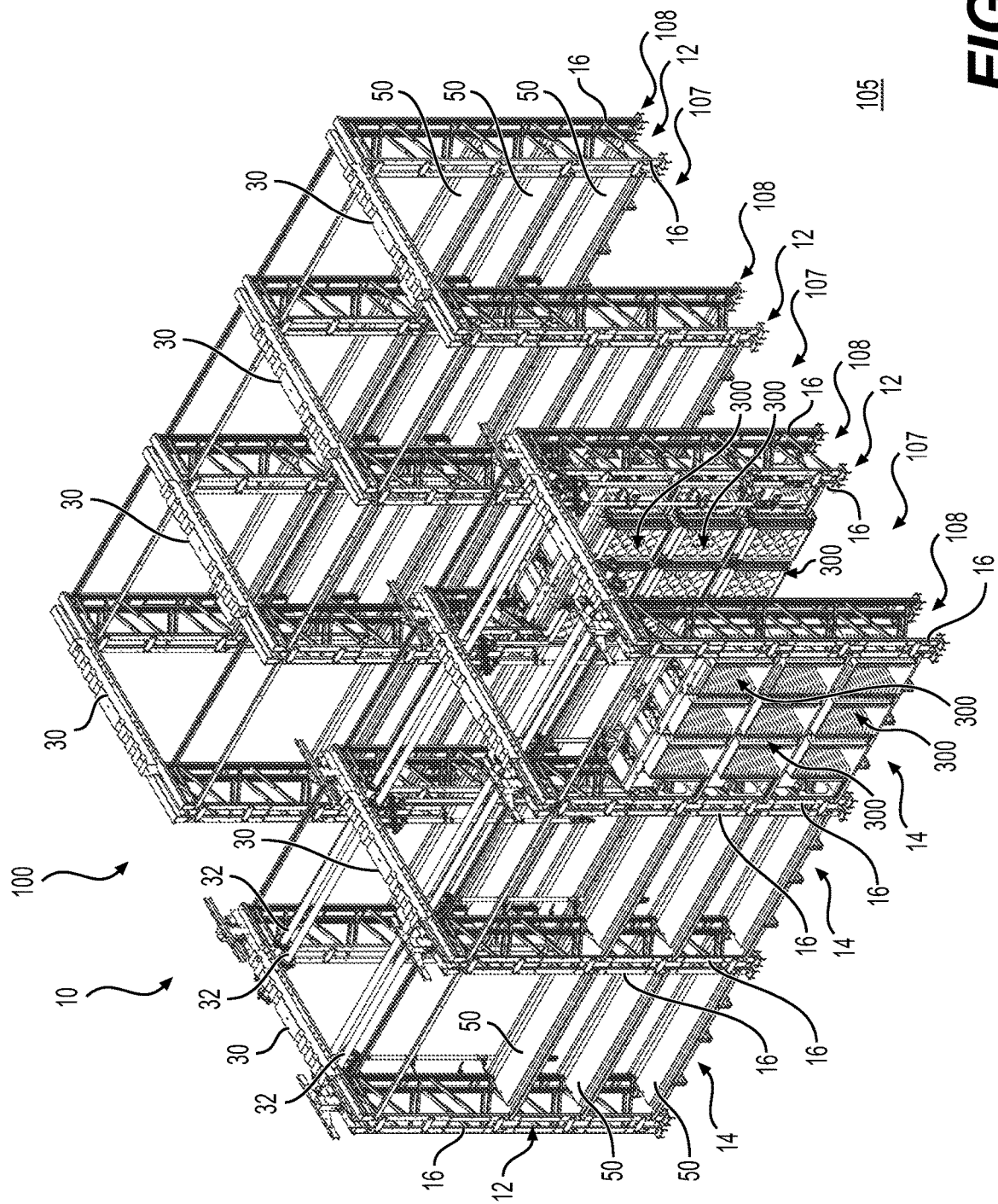
FIG. 1 is a perspective view of a data center having a rack arrangement in accordance with an embodiment of the present technology.

FIG. 1 illustrates an exemplary layout of a rack arrangement 10 for a data center 100 in accordance with an embodiment of the present technology. The data center 100 houses multiple racks 300 in which equipment for servicing the data center 100 is stored. For instance, the racks 300 include computer racks 110 in which computer equipment and associated components can be stored. In this embodiment, the computer equipment stored in the computer racks 110 includes servers and associated components thereof (e.g., power supplies) such that the computer racks 110 may also be referred to as "server racks". The racks 300 also include air handler racks 210. The air handler racks 210 are configured to cool air circulating therethrough so as to reduce the temperature of ambient air within the data center 100. It is contemplated that the air handler racks 210 may be omitted in other embodiments. As can be seen, the racks 300 are arranged in parallel rows 108 that are spaced apart from one another forming aisles 107 therebetween.

As shown in FIG. 1, the rack arrangement 10 is designed so that the racks 300 are disposed vertically above one another, taking advantage of the vertical space available in the data center 100, so as to maximize the amount of racks 300 that can fit therein. To that end, the rack arrangement 10 includes a plurality of assembly frames 12 each of which supports the racks 300 of a given one of the rows 108. The assembly frames 12 will be described in greater detail below.

The computer racks 110 and the air handler racks 210 are substantially similar in structure while being provided with different types of equipment to achieve their respective functions. The computer racks 110 and the air handler racks 210 will now be described relative to FIGS. 2A to 4.

Figure 2A:
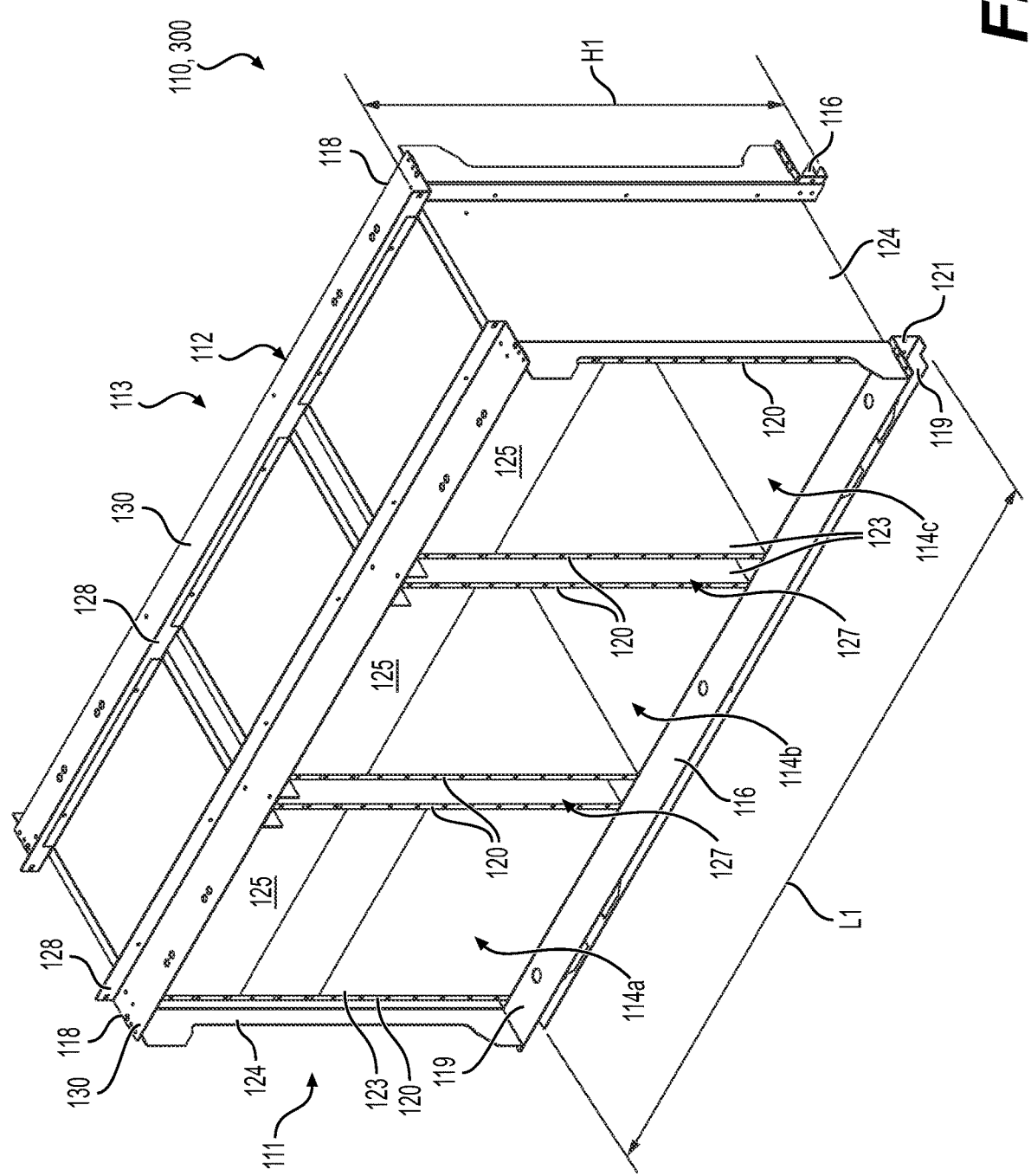
FIG. 2A is a perspective view, taken from a front, right side, of a computer rack of the rack arrangement of FIG. 1.

An example of one of the computer racks 110 is illustrated FIGS. 2A and 2B. As can be seen, the computer rack 110 has a computer rack frame 112 defining housing units 114a, 114b, 114c for housing computer equipment 125 therein. The computer rack 110 has a front side 111 through which the computer equipment 125 can be inserted and removed from the computer rack 110, and a rear side 113 opposite the front side 111. In order to dissipate heat generated by the computer equipment 125, air generally enters the computer rack 110 through the front side 111 and exits through the rear side 113. The front side 111 and the rear side 113 may thus be referred to as an air inlet side and an air outlet side respectively. In some embodiments, the computer rack 110 could include one or more heat exchangers on the rear side 113 to manage heat emitted by the computer equipment 125.

The computer rack frame 112 is "horizontally-extending" in that a greatest dimension thereof is defined horizontally. Notably, a width L1 of the computer rack frame 112, measured horizontally in a lateral direction of the computer rack 110, is greater than a height H1 of the computer rack frame 112. For instance, a ratio L1/H1 of the width L1 of the computer rack frame 12 over the height H1 of the computer rack frame 112 may be between 1.4 and 2.2, in some cases between 1.6 and 2, and in some cases between 1.8 and 1.9. In this example of implementation, the ratio L1/H1 is 1.9. The horizontally-extending nature of the computer rack frame 112 provides a lower center of gravity of the computer rack 110 compared to conventional computer racks that extend vertically. In addition, this allows placing a greater amount of racks 110, 210 atop one another in the assembly frame 12 of the rack arrangement 10.

The computer rack frame 112 has two elongated lower support members 116 and two elongated upper support members 118 disposed vertically above and parallel to the lower support members 116. The lower and upper support members 116, 118 define the width L1 of the frame 112. The lower support members 116 have a generally U-shaped cross-section including two parallel walls 119 and a transversal wall 121 connecting the parallel walls 119. The lower support members 116 are oriented such that one of the parallel walls 119 is vertically above the other parallel wall 19. Each upper support member 118 is generally L-shaped having an upwardly extending portion 128 and a horizontally extending portion 130. The horizontally extending portion 130 is parallel to the walls 119 of the lower support members 116. In this embodiment, the upwardly extending portion 128 extends generally vertically (i.e., normal to the horizontally extending portion 130).

Elongated vertical beams 120 are fastened (e.g., bolted or welded) to the lower support members 116 and the upper support members 118. Each of the housing units 114a, 114b, 114c is straddled, in the lateral direction of the computer rack 110, by two of the vertical beams 120 such that the housing units 114a, 114b, 114c are arranged horizontally side-by-side. Thus, in this example of implementation, six vertical beams 120 are fastened to each of the lower support members 116 and the upper support members 118. Notably, each of the vertical beams 120 is fastened to the transversal wall 121 of a given one of the lower support members 116. Each vertical beam 120 is aligned, in the lateral direction of the computer rack 110, with another vertical beam 120 that is affixed to an opposite lower support member 116. The vertical beams 120 define openings for affixing the rack-mountable computer equipment 125 thereto.

Panels 123 are affixed to the vertical beams 120 and extend laterally between adjacent ones of the vertical beams 120 (i.e., between the vertical beams 120 that are adjacent to one another in the depth direction of the computer rack 10) to define the housing units 114a, 114b, 114c therebetween. Channels 127 are formed between some of the panels 123 to accommodate cables and/or other components associated with operation of computer equipment such as fluid flow paths for cooling the computer equipment. End panels 124 are fastened to the ends of each of the lower and upper support members 116, 118.

In this embodiment, the computer rack 110 also includes cooling equipment to cool air exiting the rear side 113 of the computer rack 110. Notably, the computer rack 110 also includes three heat exchangers 165 (one of which is shown in FIG. 2B). Each heat exchanger 165 has a coil 167 through which a cooling fluid (e.g., water or a refrigerant) is circulated to cool the air exiting the computer rack 110 through the rear side 113. The heat exchangers 165 may be omitted in other embodiments. Fans (not shown) may also be provided to force air convection through the computer rack 110.

An exemplary one of the air handler racks 210 will now be described with respect to FIGS. 3 and 4. The air handler rack 210 has an air handler rack frame 252, a heat exchanger 254 connected to the air handler rack frame 252 and three fans 256 also connected to the air handler rack frame 252.

The air handler rack frame 252 has two elongated lower support members 262 having a generally U-shaped cross-section including two parallel walls 264 and a transversal wall 266 connecting the parallel walls 264. The lower support members 262 are oriented such that one of the parallel walls 264 is vertically above the other parallel wall 264. Elongated vertical beams 270 having a generally U-shaped cross-section are fastened to the lower support members 262. More precisely, in this example of implementation, two vertical beams 270 are fastened to each of the lower support members 262. Notably, each of the vertical beams 270 is fastened to the transversal wall 266 of a given one of the lower support members 62. Each vertical beam 270 is aligned, in the lateral direction of the air handler rack 210, with another vertical beam 270 that is affixed to an opposite lower support member 262. The vertical beams 270 affixed to a given one of the lower support members 262 are spaced apart from one another and are evenly distanced from the ends of that lower support member 262.

End panels 272 are fastened to the ends of each of the lower support members 262 and thus interconnect the lower support members 262. The air handler rack frame 252 also has two middle panels (not shown) affixed to opposite ones of the vertical beams 270.

As shown in FIG. 3, the air handler rack frame 252 also has fan mounting panels 290 on the side of the air handler rack frame 252 corresponding to the air inlet side 258 of the air handler rack 210. Each fan mounting panel 290 is fastened at one longitudinal end to one of the vertical beams 270 and at the opposite longitudinal end to another one of the vertical beams 270 or to one of the end panels 272. Each fan mounting panel 290 defines a circular aperture for permitting air flow generated by a corresponding fan 256 through the air handler rack 210.

The air handler rack frame 252 has upper support members 215 extending parallel to the lower support members 262 and disposed vertically above the lower support members 262. More specifically, the upper support members 215 are fastened to the upper ends of the end panels 272 and to the middle panels 276. Each of the upper support members 215 is generally L-shaped and has an upwardly extending portion 216 and a horizontally extending portion 218. The horizontally extending portion 218 is parallel to the walls 264 of the lower support members 262. In this embodiment, the upwardly extending portion 216 extends generally vertically (i.e., normal to the horizontally extending portion 218).

Three top cover panels 230 are fastened to the upper support members 215, middle panels 276, and (for the two top cover panels 230 near the ends of the rack 210) to the end panels 272. Three horizontally-extending floor panels (not shown) are also provided laterally aligned with corresponding ones of the top cover panels 230. Together, the middle panels 276, the end panels 272, the fan mounting panels 290, the top cover panels 230 and the floor panels define three separate compartments through which air is circulated from the air inlet side 258 to the air outlet side 260.

As will be noticed, the air handler rack frame 252 and the computer rack frame 112 are substantially similar. Notably, the air handler rack frame 252 and the computer rack frame 112 have similar dimensions. More specifically, in this example of implementation, the width L1 of the computer rack frame 112 is approximately equal (i.e., ±10%) to a width L2 of the air handler rack frame 252. Similarly, the height H1 of the computer rack frame 112 is approximately equal (i.e., ±10%) to a height H2 of the air handler rack frame 252. The similar dimensions of the frames 112, 252 are therefore standardized which can facilitate their integration within the same rows 108.

The fans 256 are configured to pull air into the air handler rack 210 via the air inlet side 258 and propel the air toward the heat exchanger 254 at the air outlet side 260. Each fan 256 has blades mounted to a hub which are rotated by a corresponding motor (not shown). Each fan 256 is mounted to a corresponding one of the fan mounting panels 290. The fans 256 are oriented such that a rotation axis of each fan 256 extends substantially horizontally (relative to a support surface 105 of the data center 100 on which the assembly frames 12 are supported).

The heat exchanger 254 is configured to absorb heat from the air being circulated therethrough by the fans 256 and to transfer that heat to a cooling fluid flowing within the heat exchanger 254. In this example of implementation, the heat exchanger 254 is in the form of a panel extending along a majority (in this case, almost the entirety) of the width L2 of the air handler rack 210. The heat exchanger 254 has a coil 222 for circulating cooling fluid (e.g., water or refrigerant) therein. To that end, the coil 222 has a fluid inlet 224 for receiving cooling fluid into the coil 222, and a fluid outlet 226 for discharging cooling fluid from the coil 222. In order to increase the surface area for effecting heat transfer, the heat exchanger 254 has fins (not shown) in thermal communication with the coil 222.

Thus, in use, air is taken from the air inlet side 258 of the air handler rack 210 and blown, by the fans 256, to the air outlet side 260 of the air handler rack 210. Heat is transferred from the air traversing the heat exchanger 254 to the cooling fluid flowing in the coil 222. As such, the temperature of the air traversing the heat exchanger 254 is lowered, resulting in cooler air exiting the air handler rack 210 at the air outlet side 260.

The computer racks 110 and the air handler racks 210 are thus similar in structure but perform different functions via the equipment which they support. Notably, the computer racks 110 support computer equipment (and could also support cooling equipment in some embodiments) while the air handler racks 210 support cooling equipment.

The assembly frames 12 of the rack arrangement 10 will now be described in greater detail with respect to FIGS. 5 to 8. Each assembly frame 12 defines various "columns" 14, each column 14 being configured to receive a plurality of the racks 300 disposed vertically above one another. As each assembly frame 12 is configured in the same manner, only one of the assembly frames 12 will be described herein. It is understood that the same description applies to the other assembly frames 12.

Figure 5:
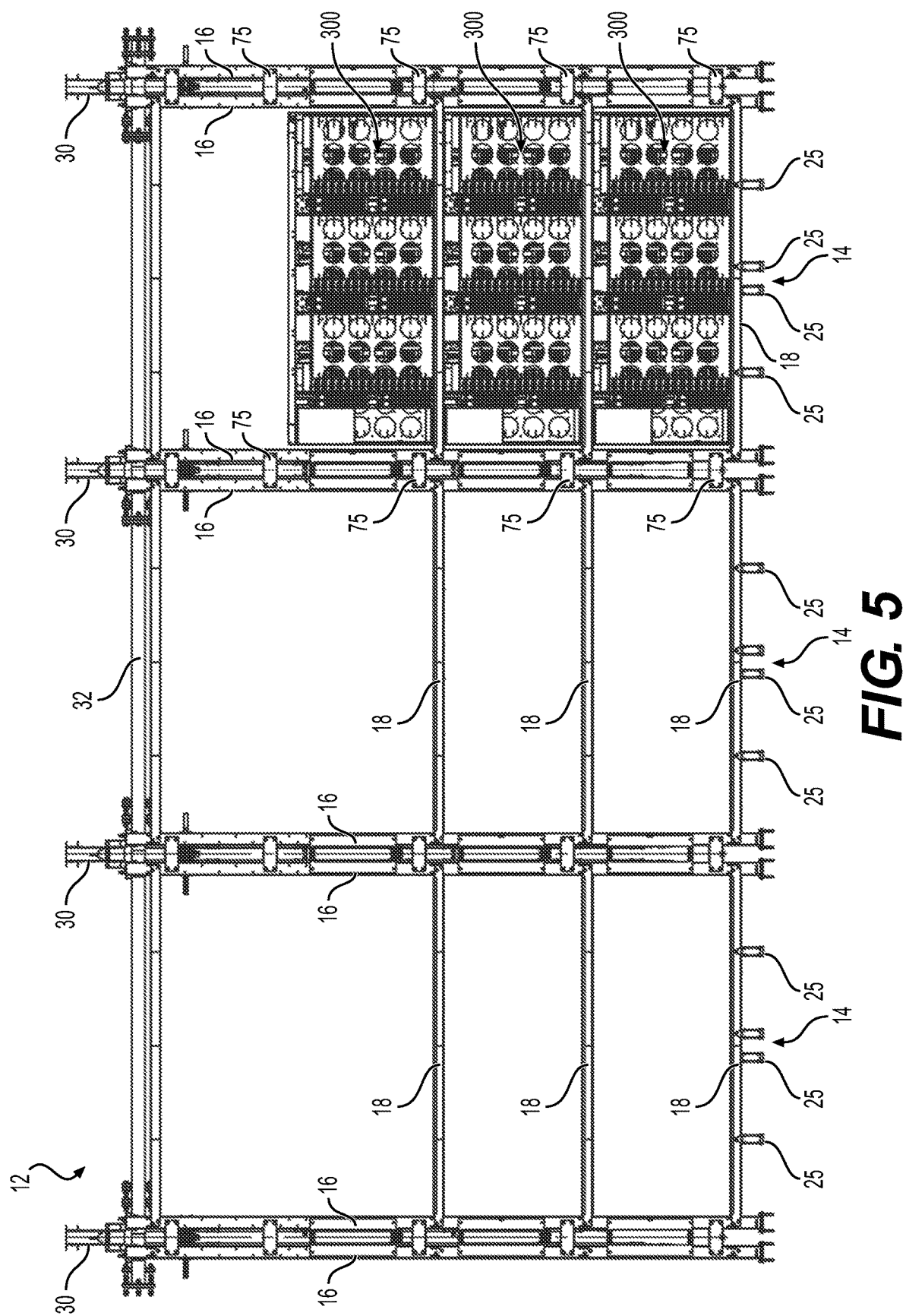
FIG. 5 is a front elevation view of part of the rack arrangement of FIG. 1.
Figure 6:
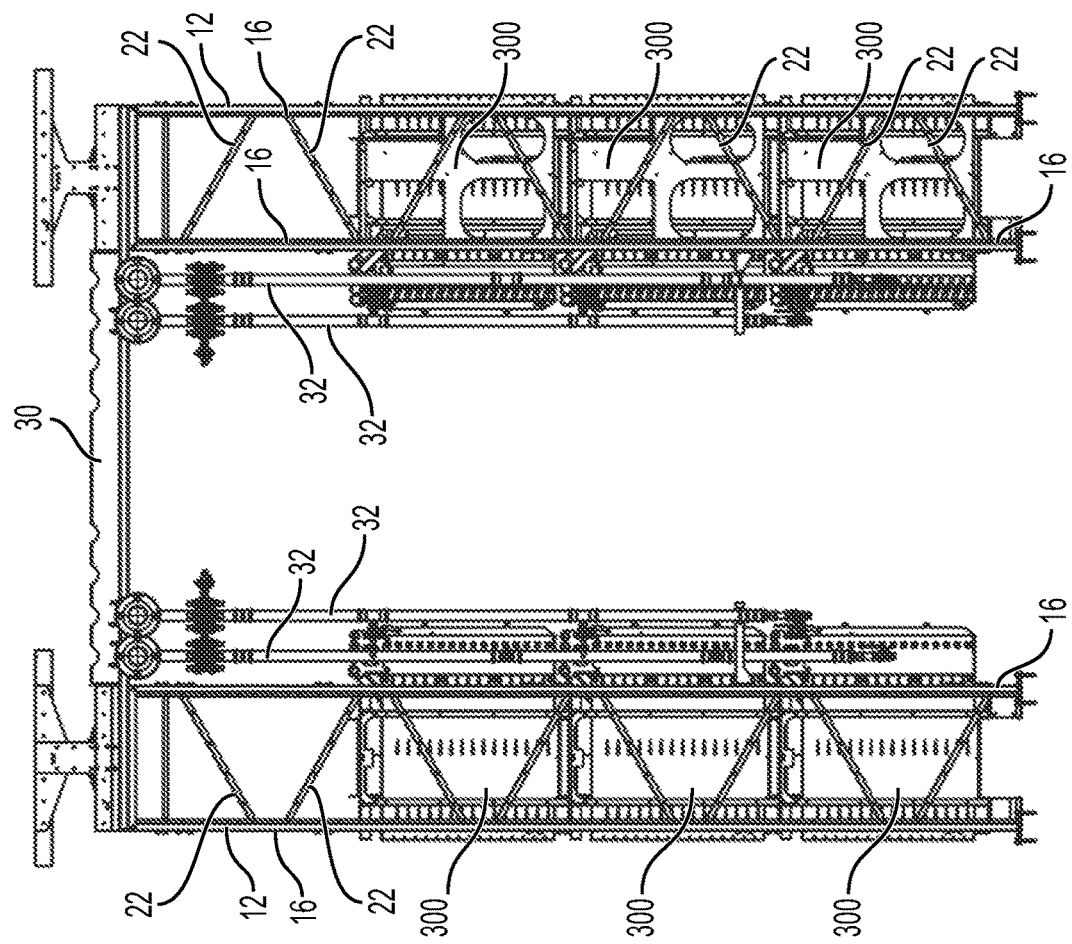
FIG. 6 is a right side elevation view of the part of the rack arrangement of FIG. 5.

As shown in FIG. 6, the assembly frame 12 includes a plurality of vertical beams 16 that extend vertically relative to the support surface 105 and are anchored thereto. Notably, the lower end of each vertical beam 16 is connected to a flange 19 (e.g., welded thereto) that is fastened to the support surface 105. As best seen in FIG. 5, each vertical beam 16 is part of a vertical beam assembly that includes two of the vertical beams 16 next to one another and interconnected to one another by a plurality of beam connecting members 75. Notably, the beam connecting members 75 are plate-like components that are attached to parallel surfaces of the two vertical beams 16 of a corresponding vertical beam assembly. Each column 14 of the assembly frame 12 is defined between four such vertical beam assemblies disposed in a rectangular pattern, with adjacent ones of the columns 14 sharing two vertical beam assemblies. In particular, each of the vertical beam assemblies defines a respective corner of the rectangular pattern formed thereby. The vertical beams 16 at each corner of a given one of the columns 14 are spaced apart from one another by distances suitable to fit the racks 110, 210 therebetween.

The vertical beams 16 are elongated components which have a cross-sectional profile that is generally C-shaped. The length of the vertical beams 16 depends on the ceiling height within the data center 100 and on how many racks 300 are to be disposed above one another in each of the columns 14. In this example of implementation, each of the vertical beams 16 has a length measured vertically of at least 3 meters. For instance, each of the vertical beams 16 may have a length between 3 meters and 6 meters or even more (e.g., 7 meters). In this particular embodiment, each of the vertical beams 16 has a length between 3.5 meters and 4 meters. Furthermore, it should be noted that each of the vertical beams 16 includes various vertical beam members that are interconnected to one another (e.g., bolted) so as to form the vertical beam 16.

In this embodiment, the vertical beams 16 are made of bent sheet metal. For instance, a thickness of the walls of the cross-sectional profile of the vertical beams 16 is between 1.5 mm and 2.5 mm. More particularly, in this example of implementation, the thickness of the walls of the cross-sectional profile of the vertical beams 16 is approximately 2 mm. As will be appreciated, making the vertical beams 16 from bent sheet metal provides a relatively light structure that is easy to manufacture. In this embodiment, the metallic material of the vertical beams 16 is galvanized steel.

A plurality of lateral beams 18 extending laterally are connected to the vertical beams 16. Notably, each lateral beam 18 is connected between two of the vertical beams 16 of a given column 14 that are laterally adjacent to one another. More particularly, the end portions of each lateral beam 18 have respective flanges 48 that are fastened (e.g., bolted) to the corresponding vertical beam 16. The lateral beams 18 are sized such that a distance between the vertical beams 16 to which any given one of the lateral beams 18 is connected is approximately equal to the widths L1, L2 of the racks 300. In particular, the distance between the vertical beams 16 to which any given one of the lateral beams 18 is connected is slightly greater than the widths L1, L2 of the racks 300.

In this example of implementation, each column 14 has three pairs of lateral beams 18 disposed above one another. That is, the lateral beams 18 corresponding to a given one of the columns 14 are paired such that the lateral beams 18 are vertically aligned with one another in pairs (each lateral beam 18 of each pair extending between two different ones of the vertical beams 16) at different heights of the vertical beams 16. For reasons that will be described in more detail below, the vertically-adjacent lateral beams 18 of a given one of the columns 14 are spaced apart by a vertical distance that is approximately equal to the heights H1, H2 of the racks 110, 210.

Figure 13:
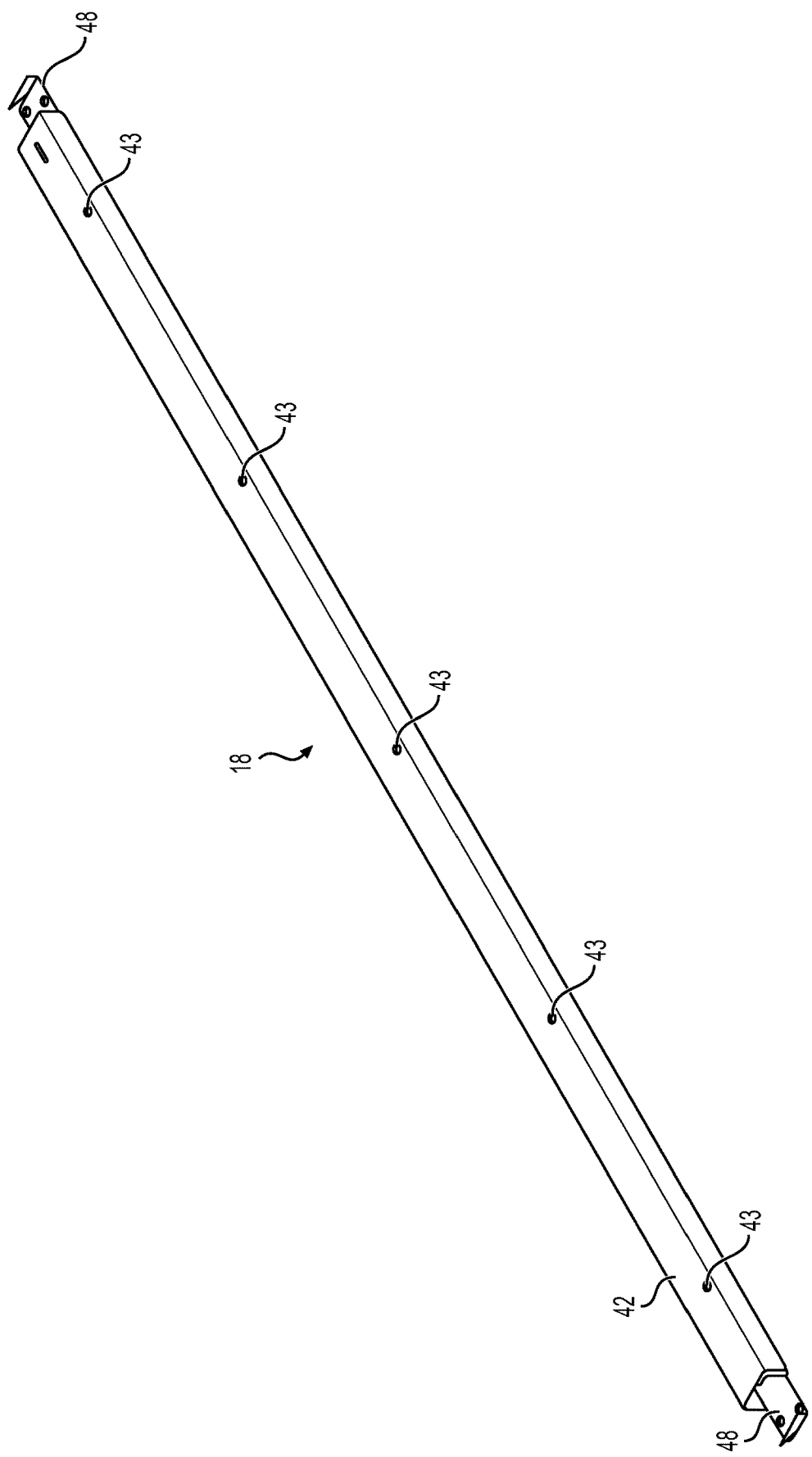
FIG. 13 is a perspective view of a lateral beam of the assembly frame of FIG. 8.
Figure 14:
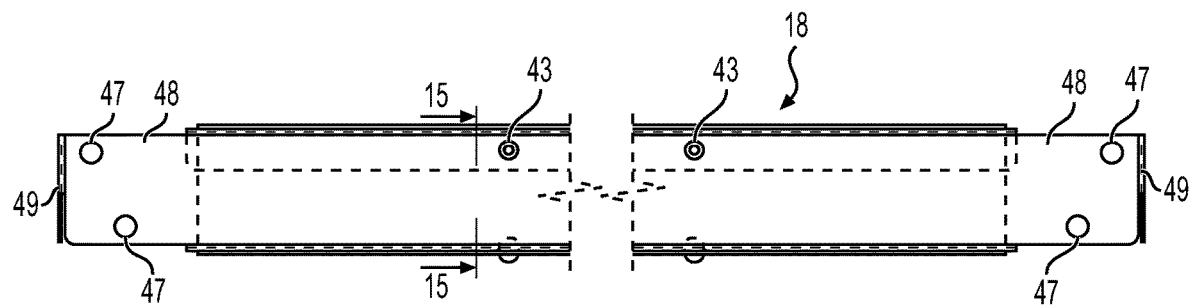
FIG. 14 is a top plan view of the lateral beam of FIG. 13.
Figure 15:
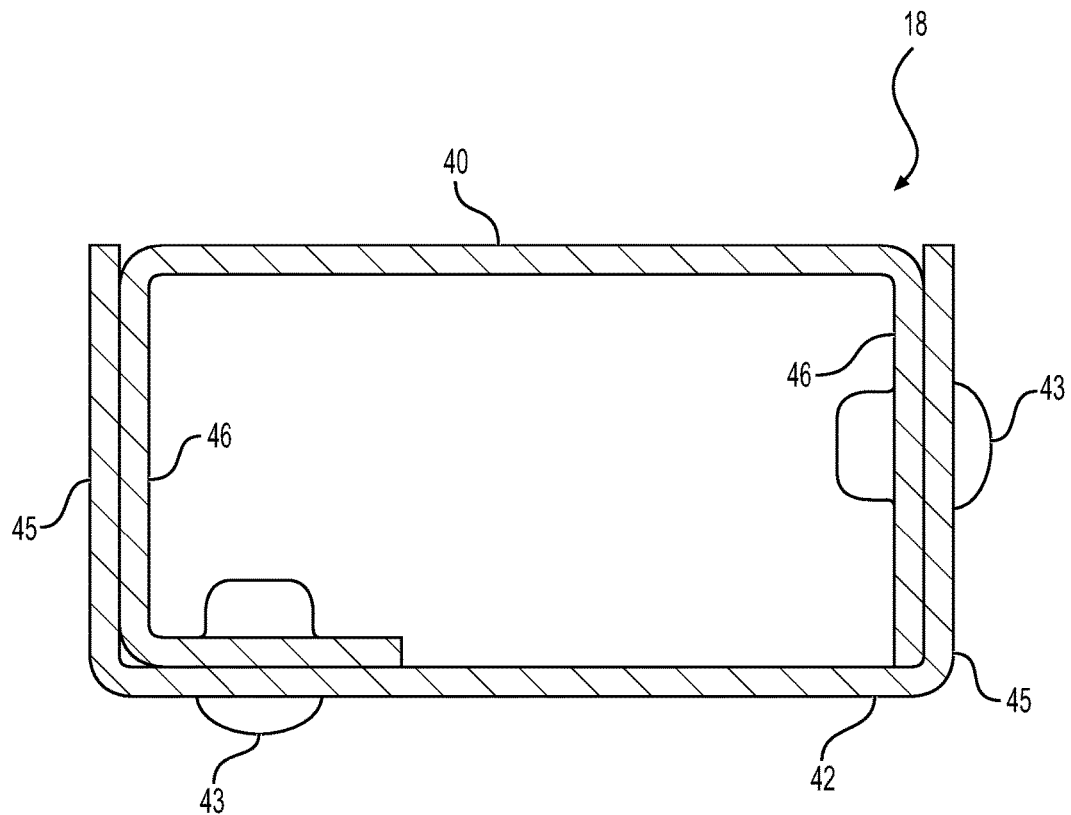
FIG. 15 is a cross-sectional view of the lateral beam of FIG. 13 taken along line 15-15 in FIG. 14.

FIGS. 13 to 15 show an exemplary one of the lateral beams 18 in greater detail. As can be seen, the lateral beams 18 are elongated members that are made of bent sheet metal and have a generally rectangular cross-sectional profile. For instance, a thickness of the walls of the cross-sectional profile of the lateral beams 18 is the same as the thickness of the walls of the vertical beams 16. As best shown in FIG. 15, each lateral beam 18 includes first and second bent sheet metal members 40, 42 which are fastened to one another via fasteners 43 (e.g., rivets). The first member 40 is received within the second member 42 which has C-shaped cross-sectional profile. Notably, the first member 40 is disposed between the two parallel walls 45 of the second member 42 such that the side walls 46 of the first member 40 are in contact with the inner surfaces of the walls 45 of the second member 42. The flanges 48 at the end portions of each lateral beam 18 are secured to the corresponding vertical beams 16. In particular, fasteners are inserted into openings 47 defined by the flanges 48 so as to fasten the lateral beams 18 to the corresponding vertical beams 16. Each flange 48 also has a wrapping portion 49 that wraps around part of the corresponding vertical beam 16. The wrapping portion 49 extends perpendicular to the portion of the flange 48 defining the openings 47. As shown in FIG. 5, the bottommost lateral beams 18 are supported by legs 25 extending between a bottom surface of the bottommost lateral beams 18 and the support surface 105.

Figure 7:
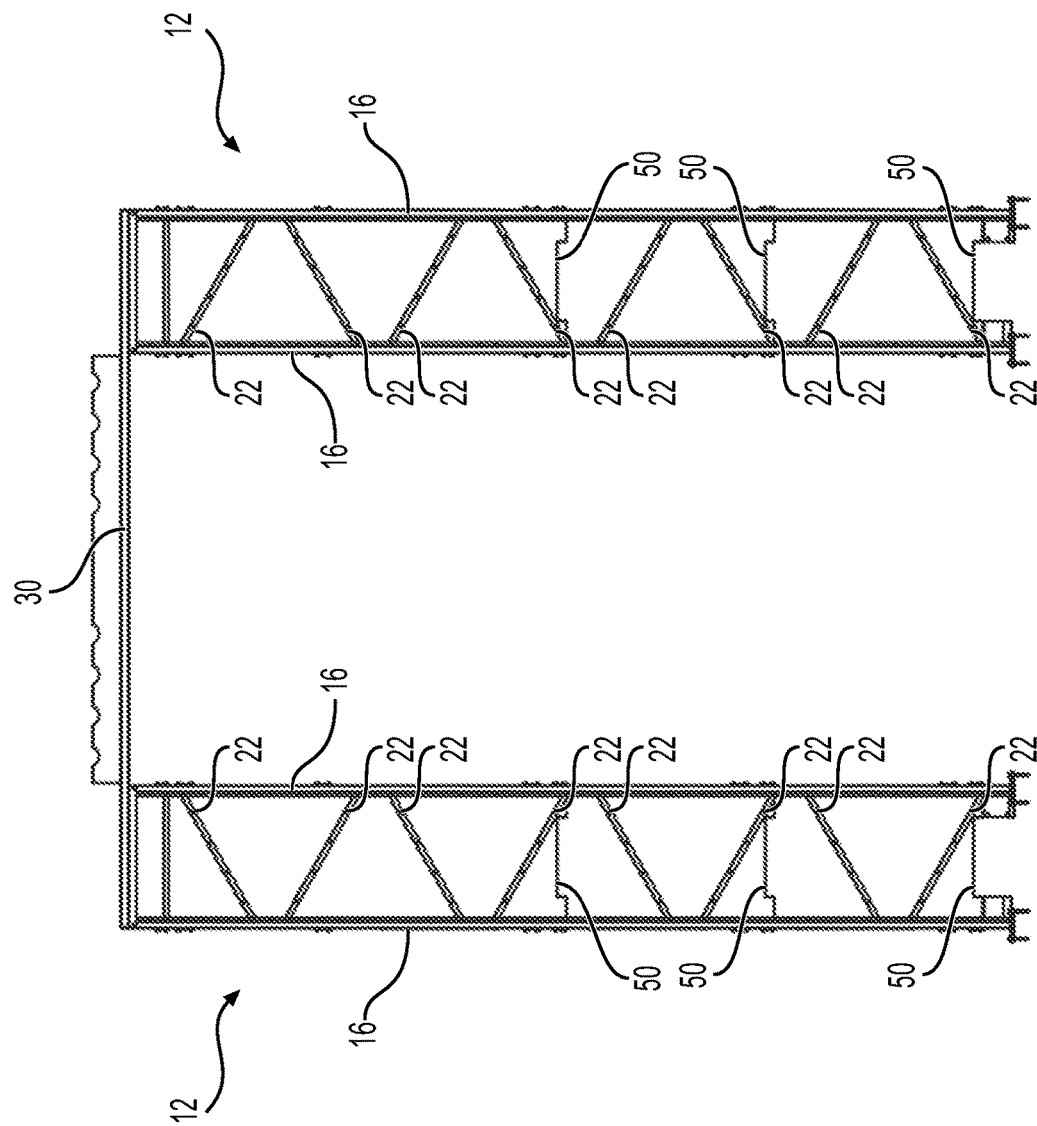
FIG. 7 is a right side elevation view of the part of the rack arrangement of FIG. 5, with the racks removed therefrom to show two assembly frames of the rack arrangement.
Figure 8:
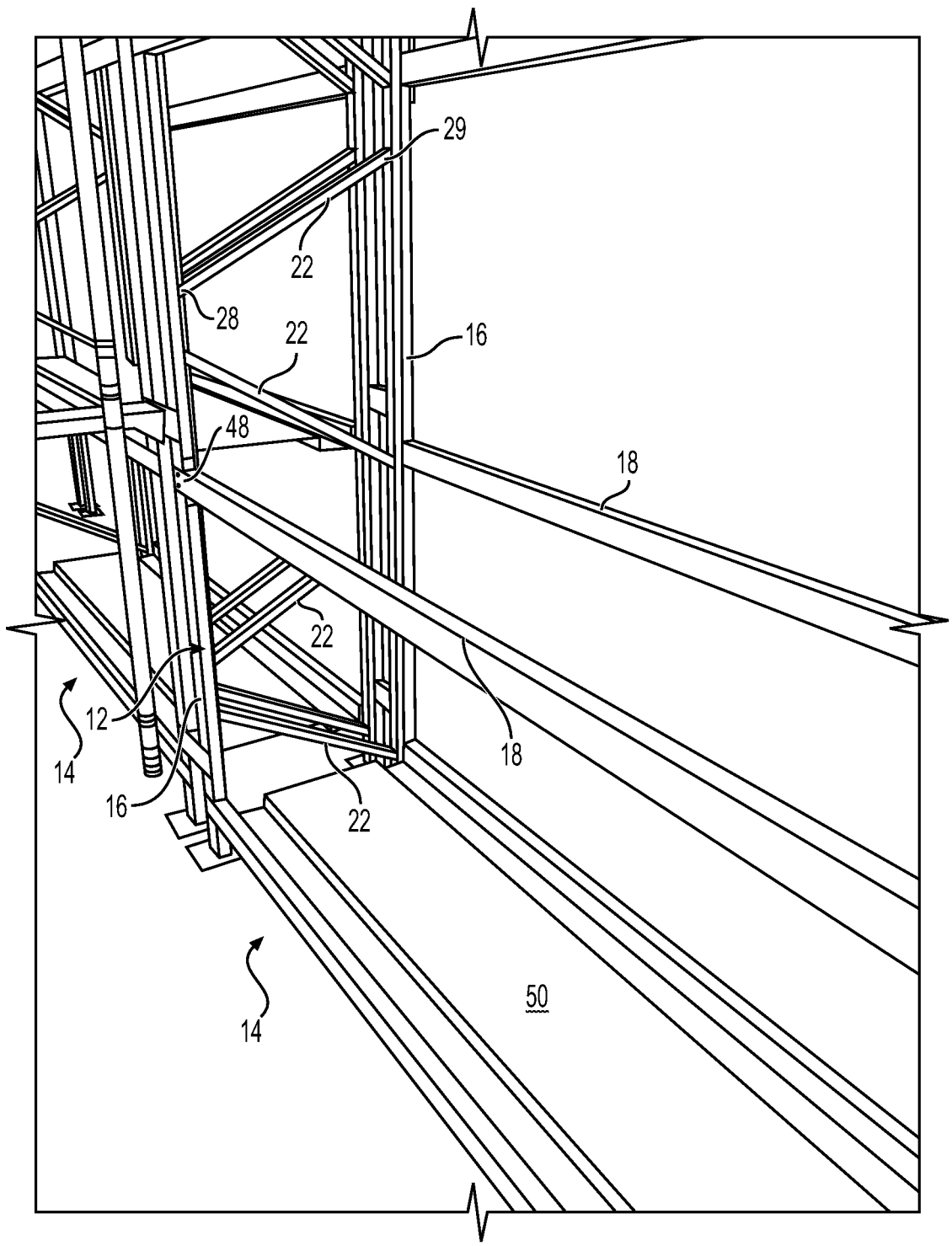
FIG. 8 is a perspective view of part of one of the assembly frames of FIG. 7.

As shown in FIG. 7, a plurality of transverse beams 22 extend partly in a depth direction of the assembly frame 12 and are connected to the vertical beams 16. More specifically, the transverse beams 22 extend in the depth direction of the assembly frame 12 and also in the vertical direction of the assembly frame 12 such that each transverse beam 22 extends, from one of the vertical beams 16, upwardly and in the depth direction of the assembly frame 12 to another vertical beam 16. Each transverse beam 22 is connected between two of the vertical beams 16 that are adjacent to one another in the depth direction of the assembly frame 12. Notably, in this embodiment, as shown in FIG. 8, each end 28, 29 of each transverse beam 22 is received in a respective opening defined by the C-shaped cross-sectional profile of a corresponding vertical beam 16.

With reference to FIGS. 11 and 12, the transverse beams 22 are elongated members that have a cross-sectional profile that is generally C-shaped. In this embodiment, the transverse beams 16 are made of bent sheet metal. For instance, a thickness of the walls of the cross-sectional profile of the transverse beams 22 is between 1 mm and 2.5 mm. For instance, in this example of implementation, the thickness of the walls of the cross-sectional profile of the transverse beams 22 is approximately 1.5 mm.

As shown in FIG. 11, each of the transverse beams 22 extends from a proximal end 28 to a distal end 29. Each of the transverse beams 22 has three walls to form the C-shaped cross-sectional profile thereof, including two parallel side walls 34 and a central wall 36 extending between the two side walls 34. Each side wall 34 defines two end openings 35, one of each disposed near one of the proximal and distal ends 28, 29. The end openings 35 are configured to receive respective fasteners therein that extend through the vertical beams 16.

The assembly frame 12 also has an upper railing 30 that is connected to the upper ends of the vertical beams 16. The upper railing 30 is configured to support conduits 32 for feeding cooling fluid (e.g., water) to the racks 300 that are supported by the assembly frame 12 and for retrieving heated fluid therefrom.

As can be seen in FIG. 7, the rack arrangement 10 includes a plurality of rack-supporting platforms 50 that are connected to the lateral beams 18 of the assembly frame 12.

As will be described in greater detail below, the rack-supporting platforms 50 are provided to support respective ones of the racks 300. The rack-supporting platforms 50 will now be described in greater detail with reference to FIGS. 9 and 10. As all of the rack-supporting platforms 50 are configured identically in this embodiment, a single one of the rack-supporting platforms 50 will be described herein. It is understood that the same description applies to the other rack-supporting platforms 50.

As shown in FIG. 9, the rack-supporting platform 50 extends from a first lateral end 52 to a second lateral end 54, defining a width of the rack-supporting platform 50 therebetween. A length of the rack-supporting platform 50 is measured between opposite longitudinal ends 56, 58 of the rack-supporting platform 50. The rack-supporting platform 50 has an upper side 60 and a lower side 62 opposite the upper side 60. As will be described below, the rack-supporting platform 50 is shaped so as to define recesses on its upper and lower sides 60, 62 to accommodate part of either a rack 110, 210 or the assembly frame 12.

In particular, the rack-supporting platform 50 is a sheet metal component that is bent to form various walls that define recesses therebetween. Notably, the rack-supporting platform 50 has two outer end walls 64 that extend generally vertically and define the respective longitudinal ends 56, 58 of the rack-supporting platform 50. Two inner end walls 66 extend parallel to the outer end walls 64 so as to form, together with respective horizontal end walls 68 extending between the outer and inner end walls 64, 66, respective end recesses 70 on the lower side 62 of the rack-supporting platform 50. The end recesses 70 are configured to receive respective lateral beams 18 of the assembly frame 12 therein. Each end recess 70 of the rack-supporting platform 50 is therefore dimensioned to receive a respective lateral beam 18.

The rack-supporting platform 50 also has two inner walls 72 extending parallel to the inner end walls 66 and disposed inwardly (i.e., closer to a middle of the rack-supporting platform 50) of the inner end walls 66. The inner end walls 66 and the inner walls 72, together with respective horizontal walls 74 extending therebetween, define two recesses 76 on the upper side 60 of the rack-supporting platform 50. As will be described in greater detail below, the recesses 76 are configured to receive therein part of a lower portion of the racks 300.

A horizontal central wall 82 extends between the inner walls 72. Together, the horizontal central wall 82 and the inner walls 72 define a central recess 80 on the lower side 62 of the rack-receiving platform 50. As will be described in greater detail below, the central recess 80 is configured to receive therein part of an upper portion of the racks 300.

The interaction between the rack-supporting platforms 50, the assembly frame 12 and the racks 300 will be described in more detail below.

The manner in which the racks 300 are disposed on the assembly frame 12 will now be described with reference to FIGS. 5, 6 and 8. The positioning of the racks 300 will be described with respect to one of the columns 14. It is understood that the same methodology applies to other columns 14.

With the assembly frame 12 provided as described above, a bottom one of the rack-supporting platforms 50 (hereinafter referred to as the "bottom rack-supporting platform") is first connected to the two bottommost lateral beams 18 of the column 14. Notably, the bottom rack-supporting platform 50 is positioned atop the two bottommost lateral beams 18 such that each of the two bottommost lateral beams 18 is received in a respective one of the end recesses 70 of the bottom rack-supporting platform 50. As such, the walls 64, 66 of the bottom rack-supporting platform 50 straddle a respective one of the lateral beams 18 on either side thereof. As will be understood, in this position, the bottom rack-supporting platform 50 extends between the four vertical beams 16 of the column 14. The bottom rack-supporting platform 50 does not need to be fastened to the bottommost lateral beams 18 since positioning the lateral beams 18 within the end recesses 70 of the bottom rack-supporting platform 50 keeps the platform 50 in place.

Once the bottom rack-supporting platform 50 is connected to the bottommost lateral beams 18, a bottom one of the racks 300 is installed so as to be disposed atop the bottom rack-supporting platform 50. The bottom one of the racks 300 will be referred to as the "bottom rack" 300 for ease of reference. The bottom rack BR is thus disposed on the upper side 60 of the bottom rack-supporting platform 50. To that end, as will be noticed, the upper sides 60 of the rack-supporting platforms 50 have a shape that matches a shape of a lower portion of the racks 300 such that part of the racks 300 can be received in the recesses 76 of the rack-supporting platforms 50. More specifically, the lower support members 116 of the computer rack frame 112 are shaped and dimensioned so as to be received within the recesses 76. Similarly, the lower support members 262 of the air handler rack frame 252 are shaped and dimensioned so as to be received within the recesses 76. The lower support members 116, 262 extend laterally when mounted to the assembly frame 12. Returning now to the bottom rack 300, the lower support members 116 of the bottom rack 300 are received in the recesses 76 of the bottom rack-supporting platform 50.

With the bottom rack 300 in place on the bottom rack-supporting platform 50, another one of the rack-supporting platforms 50 which will be hereinafter referred to as the "top rack-supporting platform" 50 is positioned atop the bottom rack 300 so that the top rack-supporting platform 50 is supported at least in part by a top portion of the bottom rack 300. Notably, the upper support members 118 of the bottom rack 300 (in this embodiment a computer rack 110) partly support the top rack-supporting platform 50. At the same time, the top rack-supporting platform 50 is connected between the two lateral beams 18 that are vertically above and adjacent the bottommost lateral beams 18. For ease of reference, these lateral beams 18 will be referred to hereinafter as the "top lateral beams" 18. In particular, the top rack-supporting platform 50 is positioned such that the recesses 70 defined on the lower side 62 of the top rack-supporting platform 50 receive the two top lateral beams 18 therein.

Once the top rack-supporting platform 50 is in place, another one of the racks 300 is installed so as to be disposed atop the top rack-supporting platform 50. This rack 300 will be referred to hereinafter as the "top rack" 300 for ease of reference. In particular, the lower support members 116 of the top rack 300 are received in the recesses 76 defined on the upper side 60 of the top rack-supporting platform 50. In other words, the lower support members 116 of the top rack 300 are supported on the walls 74 of the top rack-supporting platform 50. As such, a load of the top rack 300 (i.e., its weight) is partly applied on the bottom rack 300 through the top rack-supporting platform 50. More specifically, through the provision of the top rack-supporting platform 50, the load of the top rack 300 is distributed between (i) the top lateral beams 18, vertical beams 16 and nearby transverse beams 22 and (ii) the bottom rack 300. In particular, approximately 70% of the load of the top rack 300 is applied on the bottom rack 300 while approximately 30% of the load of the top rack 300 is applied locally on the adjacent components of the assembly frame 12 (through the top lateral beams 18 that support the top rack-supporting platform 50). In other words, at least a majority of the load of the top rack 300 is applied on the bottom rack 300.

As the bottom rack 300 is supported by the assembly frame 12 alone, its load (including its weight and the part of the load of the top rack 300 supported thereby) is distributed between the vertical beams 16 and the legs 25 supporting the bottommost lateral beams 18. Namely, approximately 70% of the load of the bottom rack 300 is distributed amongst the legs 25 and approximately 30% is distributed on the vertical beams 16 at the four corners of the column 14.

While the bottom rack 300 is supported by the assembly frame 12 and therefore the loads of the racks 300 are all ultimately supported by the assembly frame 12, as will be appreciated, the distribution of the load of the top rack 300 between the bottom rack 300 and the assembly frame 12 locally (i.e., at the interface between the top rack 300 and the assembly frame 12) allows the components of the assembly frame 12 to be made relatively light compared to if the assembly frame 12 had to locally support the entire load of the top rack 300. Notably, this distribution of the load of the top rack 300 allows the vertical beams 16, lateral beams 18 and transverse beams 22 to be made of sheet metal rather than being thick extruded components.

When the top rack 300 is in place, the process can be repeated to place a third one of the racks 300 above the top rack 300. Notably, another rack-supporting platform 50 is positioned atop the top rack 300 so as to be supported thereby and also by the lateral beams 18 that are above the top lateral beams 18, and the third one of the racks 300 is installed so as to be disposed atop that rack-supporting platform 50. The load distribution of the third rack 300 on the top rack 300 and the adjacent components of the assembly frame 12 would be the same as that described above with respect to the top rack 300. However, because of the load applied on the top rack 300, the top rack 300 applies an additional load to that described above on the adjacent components of the assembly frame 12 and the bottom rack 300, although the additional load is distributed in the same manner (i.e., approximately 70% on the bottom rack 300 and approximately 30% on adjacent components of the assembly frame 12).

This process can be repeated to stack more racks 300 on the assembly frame 12. The limit of how many racks 300 can be stacked on the assembly frame 12 is dependent on the amount of vertical space available within the data center 100 (i.e., the ceiling height). For instance, in some cases, each column 14 of the assembly frame 12 can include four or more racks 300. In some cases, up to eight racks 300 could be vertically stacked per column 14. As will be appreciated, the fact that the racks 300 are horizontally-extending (i.e., longer horizontally than vertically) helps in stacking more racks 300 within the assembly frame 12 as each rack 300 occupies less vertical space.

While a particular configuration of the racks 300 has been described herein, it should be appreciated that the configuration of the racks 300 is not particularly important. Rather, it is the fact that the rack-supporting platforms 50 are supported in part by the racks 300 thereunder that allows the above-described beneficial distribution of loads. Therefore, the racks 300 could be configured in various other ways without altering the load distribution that helps make the assembly frame 12 light yet adequately supportive of the loads of the racks 300.

Furthermore, as will be understood, once the racks 300 are stacked above one another on the assembly frame 12, a bottom one of the racks 300 cannot be removed from the assembly frame 12 without first removing another rack 300 that is stacked thereabove. However, as will be noticed, the configuration of the racks 300 allows for ease of access to the computer equipment 125 or cooling equipment (e.g., heat exchangers 165) from either side thereof so that removing the racks 300 is not necessary to perform maintenance thereon. Rather, maintenance can be done on site with the racks 300 still mounted on the assembly frame 12. This is in contrast to some conventional computer racks that must be removed from their position in a rack arrangement to be serviced.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack arrangement for a data center, comprising:
    an assembly frame comprising:
        a plurality of vertical beams extending vertically;
        a plurality of lateral beams connected to the vertical beams, each lateral beam of the plurality of lateral beams being connected between two of the vertical beams; and
        a plurality of transverse beams connected to the vertical beams, each transverse beam of the plurality of transverse beams being connected between two of the vertical beams, the transverse beams extending at least partly in a depth direction of the assembly frame;
    a rack-supporting platform connected between two of the lateral beams, the rack-supporting platform extending horizontally between four of the vertical beams, wherein a lower side of the rack-supporting platform comprises at least one lower recess, and wherein an upper side of the rack-supporting platform comprises at least one upper recess; and
    a plurality of racks supported by the assembly frame, each rack of the plurality of racks being configured to support computer equipment or cooling equipment for servicing the data center, the plurality of racks including:
        a first rack disposed below the rack-supporting platform and supported at least in part by two of the lateral beams of the assembly frame, wherein the first rack comprises a first rack frame configured for supporting first computer equipment or first cooling equipment, and wherein at least part of the first rack is received in the at least one lower recess of the rack-supporting platform; and
        a second rack disposed above the first rack and disposed atop the rack-supporting platform, wherein the second rack comprises a second rack frame for supporting second computer equipment or second cooling equipment, and wherein at least part of the second rack is received in the at least one upper recess of the rack-supporting platform;
    the rack-supporting platform being supported in part by a top portion of the first rack such that a load of the second rack is at least partly applied on the first rack through the rack-supporting platform.

2. The rack arrangement of claim 1, wherein the vertical beams, the lateral beams and the transversal beams are made of bent sheet metal.

3. The rack arrangement of claim 1, wherein the rack-supporting platform is made of bent sheet metal.

4. The rack arrangement of claim 1, wherein the rack-supporting platform extends between two of the lateral beams that are vertically aligned with one another.

5. The rack arrangement of claim 1, wherein a vertical dimension of the first rack is equal to a vertical dimension of the second rack.

6. The rack arrangement of claim 1, wherein each pair of the vertical beams that are interconnected by given ones of the lateral beams are spaced apart by a distance approximately equal to a width of any one of the first rack and the second rack.

7. The rack arrangement of claim 1, wherein:
    the second rack includes two laterally-extending support members disposed at a lower portion of the second rack;
    the at least one upper recess includes two upper recesses extending laterally; and
    the laterally-extending support members of the second rack are received in the two upper recesses of the rack-supporting platform.

8. The rack arrangement of claim 1, wherein the load of the second rack is at least partly applied on the lateral beams and vertical beams of the assembly frame.

9. The rack arrangement of claim 1, wherein:
    the rack-supporting platform is a first rack-supporting platform;
    the rack arrangement further comprises:
        a second rack-supporting platform connected between two of the lateral beams, the second rack-supporting platform extending horizontally between four of the vertical beams, the second rack-supporting platform being vertically higher than the first rack-supporting platform; and
        a third rack disposed above the second rack and disposed atop the second rack-supporting platform, the third rack comprises a third rack frame for supporting the computer equipment or the cooling equipment; and
    the second rack-supporting platform is supported in part by a top portion of the second rack such that a load of the third rack is at least partly applied on the second rack through the second rack-supporting platform.

10. The rack arrangement of claim 1, wherein the assembly frame further comprises an upper railing connected to the vertical beams, the upper railing supporting at least one conduit for feeding cooling fluid to the plurality of racks.

11. The rack arrangement of claim 8, wherein a majority of the load of the second rack is applied on the first rack.

12. A method of assembling a rack arrangement for a data center, comprising:
    providing an assembly frame comprising:
        a plurality of vertical beams extending vertically;
        a plurality of lateral beams connected to the vertical beams, each lateral beam of the plurality of lateral beams being connected between two of the vertical beams; and
        a plurality of transverse beams connected to the vertical beams, each transverse beam of the plurality of transverse beams being connected between two of the vertical beams, the transverse beams extending at least partly in a depth direction of the assembly frame;

installing a first rack such that the first rack is supported at least in part by two of the lateral beams of the assembly frame, the first rack comprising a first rack frame configured for supporting computer equipment or cooling equipment for servicing the data center; and positioning a rack-supporting platform atop the first rack such that the rack-supporting platform is supported by a top portion of the first rack, the rack-supporting platform extending between four of the vertical beams;

connecting the rack-supporting platform between two of the lateral beams, wherein a lower side of the rack-supporting platform comprises at least one lower recess, wherein an upper side of the rack-supporting platform comprises at least one upper recess, and wherein at least art of the first rack is received in the at least one lower recess of the rack-supporting platform; and installing a second rack such that the second rack is disposed atop the rack-supporting platform, wherein the second rack is configured to support computer equipment or cooling equipment for servicing the data center, wherein at least part of the second rack is received in the at least one upper recess of the rack-supporting platform, and wherein a load of the second rack is at least partly applied on the first rack through the rack-supporting platform.

13. The method of claim 12, wherein the rack-supporting platform is a first rack-supporting platform, the method further comprising:

positioning a second rack-supporting platform atop the second rack such that the second rack-supporting platform is supported by a top portion of the second rack;

connecting the second rack-supporting platform between two of the lateral beams; and installing a third rack such that the second rack is disposed atop the rack-supporting platform, the third rack being configured to support computer equipment or cooling equipment for servicing the data center, a load of the third rack being at least partly applied on the second rack through the second rack-supporting platform.

14. A rack arrangement, comprising:
an assembly frame comprising:
a plurality of vertical beams extending vertically;
a plurality of lateral beams connected to the vertical beams, each lateral beam of the plurality of lateral beams being connected between two of the vertical beams; and a plurality of transverse beams connected to the vertical beams, each transverse beam of the plurality of transverse beams being connected between two of the vertical beams, the transverse beams extending at least partly in a depth direction of the assembly frame;

a rack-supporting platform connected between two of the lateral beams, the rack-supporting platform extending horizontally between four of the vertical beams, wherein a lower side of the rack-supporting platform comprises a lower recess, and wherein an upper side of the rack-supporting platform comprises two upper recesses; and a plurality of racks supported by the assembly frame, each rack of the plurality of racks being configured to support computer equipment, the plurality of racks including:

a first rack disposed below the rack-supporting platform and supported at least in part by two of the lateral beams of the assembly frame, wherein the first rack comprises a first rack frame configured for supporting first computer equipment, and wherein at least part of the first rack is received in the lower recess of the rack-supporting platform; and a second rack disposed above the first rack and disposed atop the rack-supporting platform, wherein the second rack comprises a second rack frame for supporting second computer equipment, and wherein at least part of the second rack is received in the two upper recesses of the rack-supporting platform;

the rack-supporting platform being supported in part by a top portion of the first rack such that a load of the second rack is at least partly applied on the first rack through the rack-supporting platform.

15. The rack arrangement of claim 14, wherein the lower recess is larger than any one of the upper recesses.

16. The rack arrangement of claim 14, wherein the lower side of the rack-supporting platform further comprises two end recesses.

17. The rack arrangement of claim 16, wherein the second rack includes two laterally-extending support members disposed at a lower portion of the second rack, and wherein the laterally-extending support members of the second rack are received in the two end recesses.

18. The rack arrangement of claim 14, wherein a height of the first rack is equal to a height of the second rack.

* * * * *

UNITED STATES PATENT AND TRADEMARK OFFICE
CERTIFICATE OF CORRECTION

| | |
|---|---|
| PATENT NO. | : 11,272,637 B2 |
| APPLICATION NO. | : 17/180306 |
| DATED | : March 8, 2022 |
| INVENTOR(S) | : Chehade et al. |

It is certified that error appears in the above-identified patent and that said Letters Patent is hereby corrected as shown below:

In the Claims

Column 15, Claim 12, Lines 15-16, should read --wherein at least part of the first rack is received in the at least one lower recess of the rack-supporting platform;--

Signed and Sealed this
Twentieth Day of December, 2022

Katherine Kelly Vidal
*Director of the United States Patent and Trademark Office*